United States Patent [19]

Bertin et al.

[11] 4,198,696
[45] Apr. 15, 1980

[54] LASER CUT STORAGE CELL

[75] Inventors: Claude L. Bertin, South Burlington; John Bula, Essex, both of Vt.; Larry C. Martin, Tucson, Ariz.; Thomas A. Williams, Reston, Va.

[73] Assignee: International Business Machines Corporation, Armonk, N.Y.

[21] Appl. No.: 954,947

[22] Filed: Oct. 24, 1978

[51] Int. Cl.² ............................................. G11C 11/40
[52] U.S. Cl. ................................... 365/175; 365/228; 307/238
[58] Field of Search .................... 365/175, 228, 203; 307/238, 279

[56] References Cited

U.S. PATENT DOCUMENTS 3,777,216  12/1973  Armstrong ........................... 317/31
3,967,295  6/1976  Stewart ................................. 357/51

OTHER PUBLICATIONS

IBM Tech. Dis. Bul. vol. 19, No. 4 Sep. 1976 "Monolithic IC Fuse Link" by Deliduka et al. p. 1161.
IBM Tech. Dis. Bul. vol. 15, No. 8 Jan. 1973 "ROM Fabrication by Laser Fonmeo Connections" Cook et al. pp. 2371-2372.

Primary Examiner—Terrell W. Fears
Attorney, Agent, or Firm—John E. Hoel

[57] ABSTRACT

Use of a residual charge bleed-off diode connected to the gate of an FET device in a Read Only Storage (ROS) is disclosed. The ROS is personalized by cutting selected gate leads in an array of FETs with a laser beam. Experience has shown that static electric charges on the lead due to handling prior to cutting become isolated at the gate after the gate lead is cut, producing an unpredictable conduction state for the FET instead of a solid off-state as desired. By providing a bleed-off diode which remains connected to the FET gate after the cut is made, the charges are allowed to leak away from those FETs whose gates have been cut while, at the same time, preventing the voltage of the FET gate from floating. The diode is oriented so as to offer a high impedance to current flowing from the gate node when the gate is biased for FET conduction. This minimizes the effect of the diode on circuit speed when the gate remains connected with the balance of the read only storage circuitry. If the gate and diode have been selectively severed from the balance of the read only storage circuitry, in the course of programming the storage, any residual charge on the gate is conducted through the diode by virtue of its reverse bias leakage or forward biased conduction state, depending upon the polarity of the residual charge on the gate.

3 Claims, 3 Drawing Figures

LASER CUT STORAGE CELL

FIELD OF THE INVENTION

The invention disclosed broadly relates to storage devices and more particularly relates to read only storage arrangements where the storage sites are selectively deleted to program information into a device.

BACKGROUND OF THE INVENTION

Prior art read only storage FET arrays are comprised of rectilinear arrangements of field effect transistors whose gates are connected in column to a word line and whose drains are connected for example to a reference potential and whose sources, for example, are connected in rows to bit sense lines. The array is programmed for a particular bit configuration by selectively deleting the gate connection for selected ones of the array FET devices so that the remaining devices embody the information desired to be stored. The techniques for disconnecting the selected gates from the word lines include the mask programmable technique of growing a thick oxide in the gate region for the selected FET device or, at a later stage in the processing, selectively etching away the gate connection for the FET device or alternately, severing the connection between the gate of the FET device and the word line by electrically fusing the connection with a high current or by melting the connection with the application of a laser beam.

Experience has shown that static electric charges accumulate on the gate and its lead due to handling prior to the cutting operation and to become isolated at the gate after the gate lead is cut. This produces an unpredictable conduction state for the array FET device instead of a solid off-state as is desired. The severity of this problem is a function of the integrity of the insulation layer between the gate and the substrate at the selected FET array device whose gate has been so severed. If the gate insulator has a very high resistivity, very little charge leakage will occur between the accumulated charge on the gate and the substrate and therefore the unpredictable conduction state for the FET array device will remain in effect for a substantial period of time, possibly for months or even years. The network effect of such a charge accumulation on a severed gate is that when the bit line is interrogated by the sense amplifiers for the array, an erroneous conduction state will be detected.

Various attempts have been made in the prior art to minimize the problem of residual charge accumulation on the gate of a severed gate FET array device, but no satisfactory solution has been offered to date. For example, Deliduka, et al. has disclosed in the IBM Technical Disclosure Bulletin, September 1976, page 1161 shows a monolithic integrated circuit fuse link wherein the integrated circuit is subjected to handling during the course of fabrication and, to protect the circuit from electrostatic charges, a protective diode is connected to the circuit by means of a fuse link. After handling is finished, the fuse link is severed. The fuse link then separates the protective diode from the circuit to be protected and thus the operation as disclosed by Deliduka does not provide for the participation of any accumulated charge on the integrated circuit after the circuit has been severed.

Other physical phenomena will inadvertently introduce charge to the severed gate of an FET array device so as to give an unpredictable conduction state for that device. For example, photoelectric charging by virtue of exposing the severed gate to ambient light will cause the conduction state for the device to change. Furthermore, ionic contamination from inadvertently introduced sodium ions, for example, will cause the gradual electrostatic charging of the severed gate, thereby producing an unpredictable conduction state for the FET array device. Both of these phenomena which produce inadvertent charging of the gate after it has been severed from the word line, produce unpredictable conduction problems which are not solved by the prior art techniques such as that disclosed by Deliduka. Finally, coupling of stray electric fields can cause accumulation of charge on the floating gate which needs a discharge path.

OBJECTS OF THE INVENTION

It is therefore an object of the invention to provide an improved FET read only storage device.

It is still another object of the invention to provide FET read only storage array devices having a more predictable conduction state than has been available in the prior art.

It is still a further object of the invention to provide an FET read only storage circuit which can be selectively programmed in an improved manner.

SUMMARY OF THE INVENTION

These and other objects, features, and advantages of the invention are accomplished by the laser cut storage cell disclosed herein. Use of a residual charge bleed-off diode connected to the gate of an FET device in a read only storage is disclosed. The ROS is personalized by cutting selected gate leads in an array of FETs with a laser beam. Experience has shown that static electric charges on the lead due to handling prior to cutting become isolated at the gate after the gate lead is cut, producing an unpredictable conduction state for the FET instead of a solid off-state as desired. By providing a bleed-off diode which remains connected to the FET gate after the cut is made, the charges are allowed to leak away from those FETs whose gates have been cut while, at the same time, preventing the voltage of the FET gate from floating. The diode is oriented so as to offer a high impedance to current flowing from the gate node when the gate is intentionally biased for FET conduction. This minimizes the effect of the diode on circuit speed when the gate remains connected with the balance of the read only storage circuitry. If the gate and diode have been selectively severed from the balance of the read only storage circuitry, in the course of programming the storage, any residual charge on the gate is conducted through the diode by virtue of its reverse bias leakage or forward biased conduction state, depending upon the polarity of the residual charge on the gate.

DESCRIPTION OF THE FIGURES

These and other objects, features, and advantages of the invention can be more fully appreciated with reference to the accompanying figures.

DISCUSSION OF THE PREFERRED EMBODIMENT

Use of a residual charge bleed-off diode connected to the gate of an FET device in a read only storage is disclosed. The ROS is personalized by cutting selected gate leads in an array of FETs with a laser beam. Experience has shown that static electric charges on the lead due to handling prior to cutting become isolated at the gate after the gate lead is cut, producing an unpredictable conduction state for the FET instead of a solid off-state as desired. By providing a bleed-off diode which remains connected to the FET gate after the cut is made, the charges are allowed to leak away from those FETs whose gates have been cut while, at the same time, preventing the voltage of the FET gate from floating. The diode is oriented so as to offer a high impedance to current flowing from the gate node when the gate is intentionally biased for FET conduction. This minimizes the effect of the diode on circuit speed when the gate remains connected with the balance of the read only storage circuitry. If the gate and diode have been selectively severed from the balance of the read only storage circuitry, in the course of programming the storage, any residual charge on the gate is conducted through the diode by virtue of its reverse bias leakage or forward biased condition state, depending upon the polarity of the residual charge on the gate.

Figure 1:
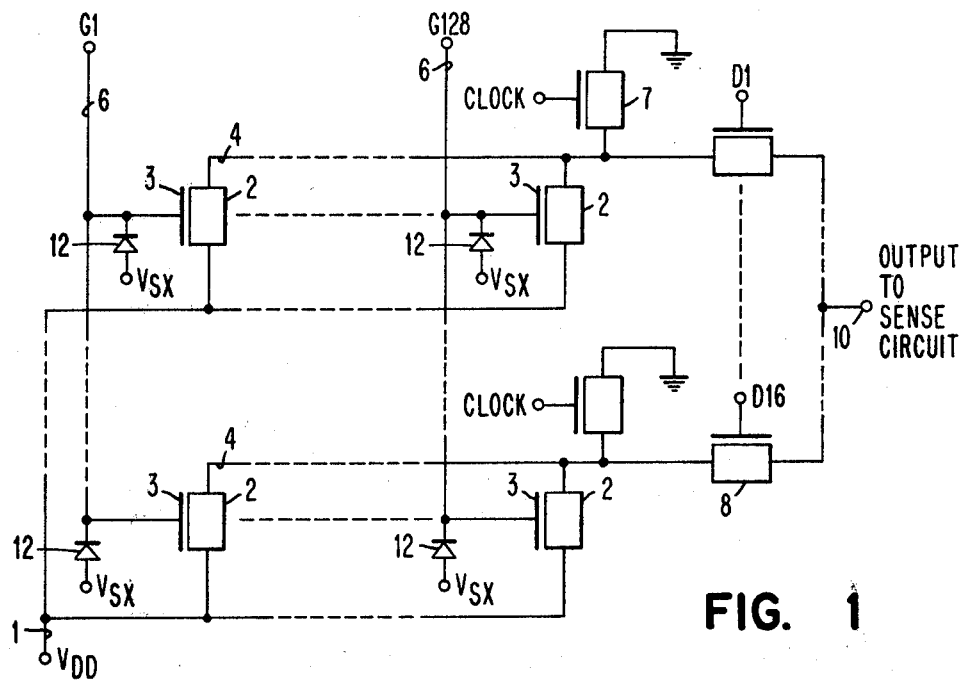
FIG. 1 is a schematic diagram of the read only storage array employing the laser cut storage cell invention.

FIG. 1 illustrates a schematic diagram of the FET ROS array employing the bleed-off diode. The circuit is arranged into horizontal rows of FET array devices to having their respective drains connected in common to the drain potential $V_{DD}$ and their sources connected in common to respective bit sense lines 4. The FET array devices 2 are arranged into vertical columns, each column having its gates connected in common to a word line 6. The array is selectively programmed after fabrication of the gate electrodes for all of the array devices, by selectively severing the gate connections for selected ones of the array devices 2 by rendering incident a laser beam to melt and separate the respective severed portions of the gate connection with the word line 6. In operation, when one of the word lines 6 are pulsed, those FET array devices 2 which still have their gates connected to the word line which is being pulsed, go into a conduction state and connect the potential $V_{DD}$ of their drain to the bit line 4, which potential is transmitted through the transfer device 8 to an output node 10 connected to a sense amplifier.

As was stated above, the FET array device 2 has its drain connected to the drain voltage $V_{DD}$, its source connected through the bit line 4 to the output node 10 and its gate connected to the input word line 6, for storing one binary bit of information by the selective disconnection of the gate electrode from the word line 6. Laser programmable read only storage (ROS) devices typically have all of their array devices FET fully formed with gates connected to their respective word lines. In this condition the ROS devices may be stockpiled. When particular applications for the ROS devices arise, ROS devices may be withdrawn from the stockpile and selected array FET thereon may have their gates severed from their respective word lines by laser cutting, so as to program the ROS devices with the desired personalization pattern. The laser personalization may be conducted through an optically transparent quarts passivation layer, for example. The resulting overall process provides a fast response time to specific applications.

Figure 2:
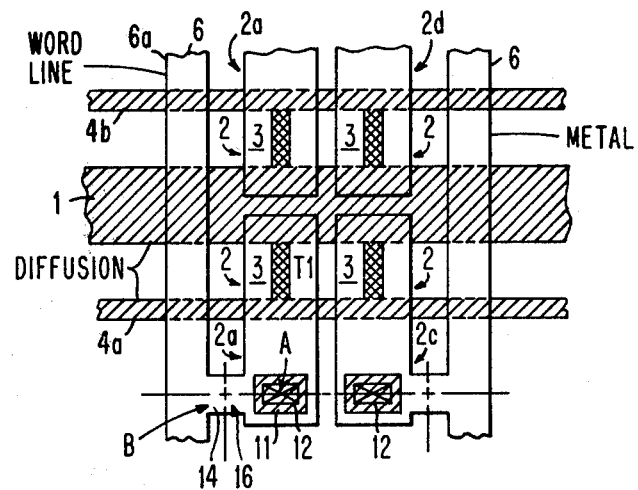
FIG. 2 is a plan view of the layout for a selected portion of the laser cut storage cell array, featuring the bleeder diode.

The FET array devices formed in the array can be either n channel devices where the substrate is a p-type conductivity or they can be p channel devices where the substrate is of n-type conductivity, as shown in FIG. 2. In an n channel device, for example, the FET array device is formed by diffusing n-type conductivity diffusions for the source and drain regions into the p-type conductivity substrate. Thus, for enhancement mode FET array devices, the n channel device will conduct when a relatively positive gate to source potential is imposed upon the gate of the device. In this situation, the formation of the diode 12 is accomplished by diffusing an n-type conductivity diffusion into the p-type substrate to form the bleeder diode 12 which has its cathode connected to the gate of the FET array device 2. If, for example, the array were p channel where the substrate is of n-type conductivity, then the bleeder diode 12 would be formed by diffusing a p-type conductivity material thereby causing the anode of the diode to be connected to the gate of the FET array device 2. The diode 12 has its first pole, which is its cathode in the case of n channel FET array devices, connected to the gate node of the FET array device 2 and its second pole, in this example the anode, connected to the substrate potential $V_{sx}$. In this orientation, the bleeder diode 12 will be reverse biased when the gate node for the FET device 2 is biased to make the FET device conductive. In this manner, electrostatic charge will be transferred from the gate node to the substrate by the reverse leakage current of diode while, for those FET array devices 2 which remain connected to their respective word lines, a positive gating pulse on the word line will not be clamped to the substrate voltage by the diode but the pulse instead will be effective to turn the selected array device on, as intended. Thus, for an n channel FET array device 2 whose gate has been severed from the word line, positive accumulated electostatic charges on the gate will be conducted to the substrate by the diode 12 through its reverse biased leakage current so that an inadvertently positively charged gate will not cause the FET array device 2 to conduct. If the accumulated electrostatic charge on the gate of the severed FET device 2 were negative, it would be conducted to ground by virtue of the forward biased condition of the diode 12.

The orientation of the diode and its permanent connection to the corresponding gate of the FET device 2 minimizes the loading of the gate node when the severable link remains intact with its associated word line by remaining reverse biased when a positive input signal, for an n channel device, is present on the word line 6.

FIG. 2 illustrates a plan view of the layout of the FET read only storage array whose schematic diagram is shown in FIG. 1. An individual storage cell consists of the FET device 2 having a thin oxide layer between the substrate and the overlying metal gate 3, between the source or bit line 4a, for example, and the drain or $V_{DD}$ line 1. The gate metal 3 is connected to the diode diffusion alone which, in the case of an n channel FET device, will be a n-type diffusion, thereby forming the bleeder diode 12. The gate metal is then connected by the link portion 14 to the word line 6. To selectively sever the FET array device 2a from its corresponding word line 6a, a laser beam is selectively directed along the line 16 of the link portion 14 of the metallized layer connecting the metal gate 3 to the metal word line 6a. Thus, when a positive word line pulse is applied to the word line 6a, the array device 2b, would provide $V_{DD}$ potential on its bit line 4b while the array device 2a would not cause the potential of its bit line 4a to change.

Figure 3:
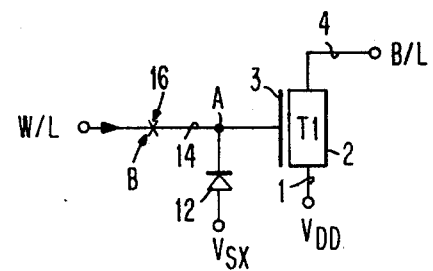
FIG. 3 is a more detailed schematic diagram of a single FET ROS array cell.

FIG. 3 illustrates the electrical schematic diagram for the array device showing the location of the cut 16 with respect to the diode 12.

While the invention has been particularly shown and described with reference to the preferred embodiment thereof, it will be understood by those skilled in the art that the foregoing and other changes in form and detail may be made therein without departing from the spirit and scope of the invention.

Having thus described our invention, what we claim as new, and desire to secure by Letters Patent is:

1. An FET read only storage circuit, comprising:
   an FET device having a drain connected to a drain voltage, a source connected to an output node and a gate connected to a gate node, for storing one binary bit of information by the selective disconnection of said gate node with a signal input node;
   a diode having a first pole connected to said gate node and a second pole connected to a reference voltage, oriented to be reversed biased when said gate node is biased to make said FET device conductive, for transferring electrostatic charge from said gate node;
   a severable conductive link connected between said gate node and a signal input node, for selectively storing in said FET device one binary bit;
   said diode minimizing the loading of said gate node when said severable link remains intact by remaining reversed biased when an input signal is present on said input node;
   said diode removing residual charge from said gate node and preventing the potential of said gate node from floating when said severable link is severed.

2. The FET read only storage circuit of claim 1, wherein said FET device is an N-channel device and said diode is polled with its cathode connected to said gate node.

3. The FET read only storage circuit of claim 1, wherein said FET device is a P-channel device and said diode is polled with its anode connected to said gate node.

* * * * *